United States Patent
Toribatake

(10) Patent No.: US 10,170,713 B2
(45) Date of Patent: Jan. 1, 2019

(54) DISPLAY DEVICE AND MANUFACTURING METHOD THEREFOR

(71) Applicant: Japan Display Inc., Minato-ku (JP)

(72) Inventor: Kenji Toribatake, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/860,825

(22) Filed: Jan. 3, 2018

(65) Prior Publication Data

US 2018/0212168 A1 Jul. 26, 2018

(30) Foreign Application Priority Data

Jan. 24, 2017 (JP) .................................. 2017-010263

(51) Int. Cl.
| | |
|---|---|
| *H01L 33/54* | (2010.01) |
| *H01L 51/00* | (2006.01) |
| *H01L 27/32* | (2006.01) |
| *H01L 51/52* | (2006.01) |

(52) U.S. Cl.
CPC ...... *H01L 51/0097* (2013.01); *H01L 27/3248* (2013.01); *H01L 27/3276* (2013.01); *H01L 33/54* (2013.01); *H01L 51/5246* (2013.01); *H01L 51/5253* (2013.01)

(58) Field of Classification Search
CPC ........................................................ H01L 24/93
See application file for complete search history.

(56) References Cited

U.S. PATENT DOCUMENTS

| | | |
|---|---|---|
| 2014/0367644 A1 | 12/2014 | Song et al. |
| 2016/0174304 A1 | 6/2016 | Kim et al. |

*Primary Examiner* — Cheung Lee
(74) *Attorney, Agent, or Firm* — Oblon, McClelland, Maier & Neustadt, L.L.P.

(57) ABSTRACT

The display device includes a display circuit layer having a hollow at a middle area, a front film overlapping a first area, a resin layer, a first back film overlapping the first area and stuck to a back surface of a resin substrate so as to protrude from the hollow at a boundary between the first area and the middle area, and a second back film overlapping the second area and stuck to the back surface of the resin substrate so as to protrude from the hollow at a boundary between the second area and the middle area. The display circuit layer includes an inorganic insulating layer which has the hollow. The first back film and the second back film are separated by the middle area in the first direction.

13 Claims, 17 Drawing Sheets

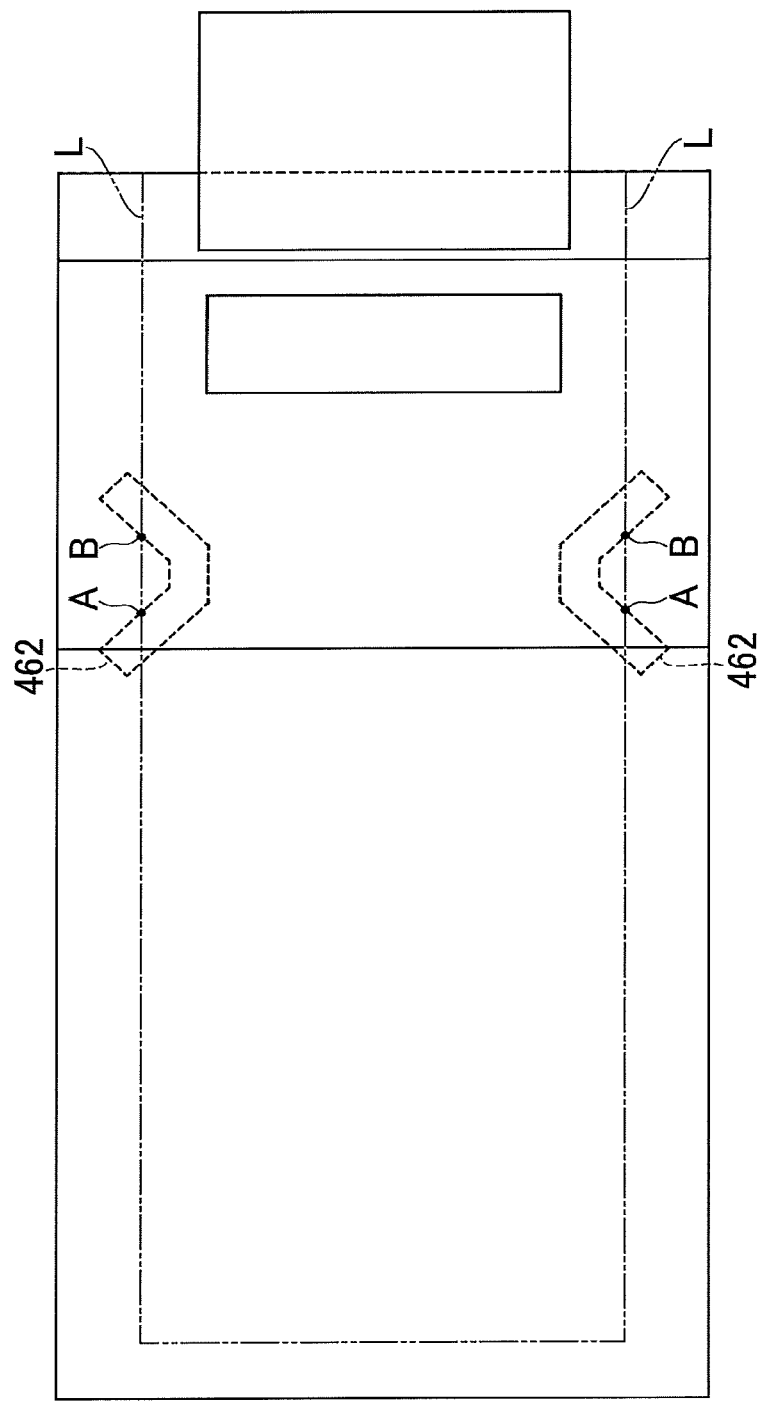

DISPLAY DEVICE AND MANUFACTURING METHOD THEREFOR

CROSS-REFERENCE TO RELATED APPLICATION

The present application claims priority from Japanese application JP 2017-010263 filed on Jan. 24, 2017, the content of which is hereby incorporated by reference into this application.

BACKGROUND OF THE INVENTION

1. Field of the Invention

The present invention relates to a display device and a manufacturing method therefor.

2. Description of the Related Art

In recent years, the development of a sheet-like display capable of being bent using a light emitting body such as an organic light emitting diode (OLED) has advanced (US 2016/0174304 A1 and US 2014/0367644 A1). The display has a structure in which a thin film transistor, a light emitting element, and the like are laminated on an organic substrate made of a polyimide resin or the like. For reinforcement, a film is stuck to the front and back surfaces of the display.

Sticking of the film facilitates planarization of the display. On the other hand, when the display is bent, stress of the film affects the display. Accordingly, the film can be stuck so as to avoid a bent portion of the display. Further, in the bent portion, the wiring is in the vicinity of the uppermost layer on a front side and thus, provision of a resin layer on the bent portion also prevents disconnection of the wiring. However, there is a problem that the resin layer is provided so as to make it difficult to bend the display.

There is a problem that since the resin layer is not provided on a back side of the display, there is a difference in thickness between a region where the film is present and a region where the film is not present and an organic substrate may be deformed and torn off or cracks may be generated in an inorganic film on the organic substrate in a cutting process for shaping an outer shape of the product.

SUMMARY OF THE INVENTION

The present invention has an object to improve ease of bending and, additionally, to prevent occurrence of defects in a manufacturing process.

A display device according to the present invention includes a substrate having a front surface and a back surface, a display circuit layer which is laminated on the front surface and includes a first area and a second area, which are aligned and apart from each other in a first direction, a middle area, which is positioned between the first area and the second area and of which a width in a second direction orthogonal to the first direction is narrower than a width of any of the first area and the second area, and a hollow recessed in the middle area in the second direction, a first film overlapped with the first area and stuck to the display circuit layer, a resin layer provided on the display circuit layer so as to range from the middle area to the second area adjacently to the first film, a second film overlapped with the first area and stuck to the back surface of the substrate, and a third film positioned apart from the second film, overlapped with the second area, and stuck to the back surface of the substrate, and in the display device, the display circuit layer includes a light emitting element, a thin film transistor, and an inorganic insulating layer, and the inorganic insulating layer is positioned at an edge of the hollow.

According to the present invention, the middle area of the display circuit layer is constricted by the hollow and thus, ease of bending of the display device is improved.

A display device according to the present invention includes a substrate having a front surface and a back surface, a display circuit layer which is laminated on the front surface and includes a first area and a second area, which are aligned in a first direction and apart from each other in the first direction, a middle area, which is positioned between the first area and the second area and has a slit extending in the first direction, a first film overlapped with the first area and stuck to the display circuit layer, a resin layer provided on the display circuit layer so as to range from the middle area to the second area adjacently to the first film, a second film stuck to the back surface of the substrate so as to overlap the first area and protrude to the middle area, and a third film stuck to the back surface of the substrate so as to overlap the second area and protrude to the middle area, and in the display device, the display circuit layer includes a light emitting element, a thin film transistor, and an inorganic insulating layer, the resin layer overlaps the slit, and mutually facing end portions of the second film and the third film overlap the slit.

According to the present invention, the slit are formed in the middle area of the display circuit layer and thus, ease of bending of the display device is improved.

A manufacturing method for a display device according to the present invention includes forming a display circuit layer, which includes a first area and a second area aligned and apart from each other in a first direction and a middle area positioned between the first area and the second area, on a front surface of a resin substrate, sticking a front film to the display circuit layer so as to overlap the first area, forming a resin layer on the display circuit layer so as to range from the middle area to the second area adjacently to the front film; sticking a first back film to the back surface of the resin substrate so as to overlap the first area and protrude to the middle area, sticking a second back film to the back surface of the resin substrate so as to overlap the second area and protrude to the middle area, forming through-holes in the middle area of the display circuit layer by irradiating the middle area with ultraviolet laser light through the front film and the resin layer, and cutting out a product along a cutting line passing through the through-holes by abutting a cutter to sides of the front film and the resin layer on a stage by directing the first back film and the second back film downward, and in the process for forming the through hole, the middle area is irradiated with the ultraviolet laser light up to a position inside thereof which overlaps mutually facing ends of the first back film and the second back film and in the process for cutting out the product, the middle area of the display circuit layer is bridged over the first back film and the second back film, and is bent in a direction toward the stage by pressing of the cutter.

According to the present invention, a product is cut out along a cutting line which passes through the through hole. For that reason, even when the middle area of the display circuit layer is bent, defects due to deformation are hardly generated. The middle area of the display circuit layer is cut out along a cut line so as to pass through the through-holes and thus, the hollow is formed with the middle area constricted, so that flexibility of the display device is improved.

A manufacturing method for a display device according to the present invention includes forming a display circuit layer, which includes a first area and a second area aligned and apart from each other in a first direction and a middle area positioned between the first area and the second area, on a front surface of a resin substrate, sticking a front film to the display circuit layer so as to overlap the first area, forming a resin layer on the display circuit layer so as to range from the middle area to the second area adjacently to the front film, sticking a first back film to the back surface of the resin substrate so as to overlap the first area and protrude to the middle area, sticking a second back film to the back surface of the resin substrate so as to overlap the second area and protrude to the middle area, forming a slit in the middle area of the display circuit layer by irradiating the middle area with ultraviolet laser light with intensity not reaching the back surface of the resin substrate through the front film and the resin layer, and cutting out a product along a cutting line which passes through outside the slit by avoiding the slit, by abutting a cutter to sides of the front film and the resin layer on a stage by directing the first back film and the second back film downward, and in the process for forming the slit, the middle area is irradiated with ultraviolet laser light to a position inside thereof which overlaps mutually facing ends of the first back film and the second back film, and in the process for cutting out the product, the middle area of the display circuit layer is bridged over the first back film and the second back film and is bent in a direction toward the stage by pressing of the cutter.

According to the present invention, a product is cut out along the cutting line which passes through outside the slit. For that reason, even when the middle area of the display circuit layer is bent and a crack is generated, the crack is less likely to expand inside the product, so that defects due to deformation are hardly generated. The slit are formed in the middle area of the display circuit layer and thus, ease of bending of the display device is improved.

BRIEF DESCRIPTION OF THE DRAWINGS

FIG. 17 is a diagram for explaining a manufacturing method for a display device according to a fourth embodiment of the present invention.

DETAILED DESCRIPTION OF THE INVENTION

Figure 1:
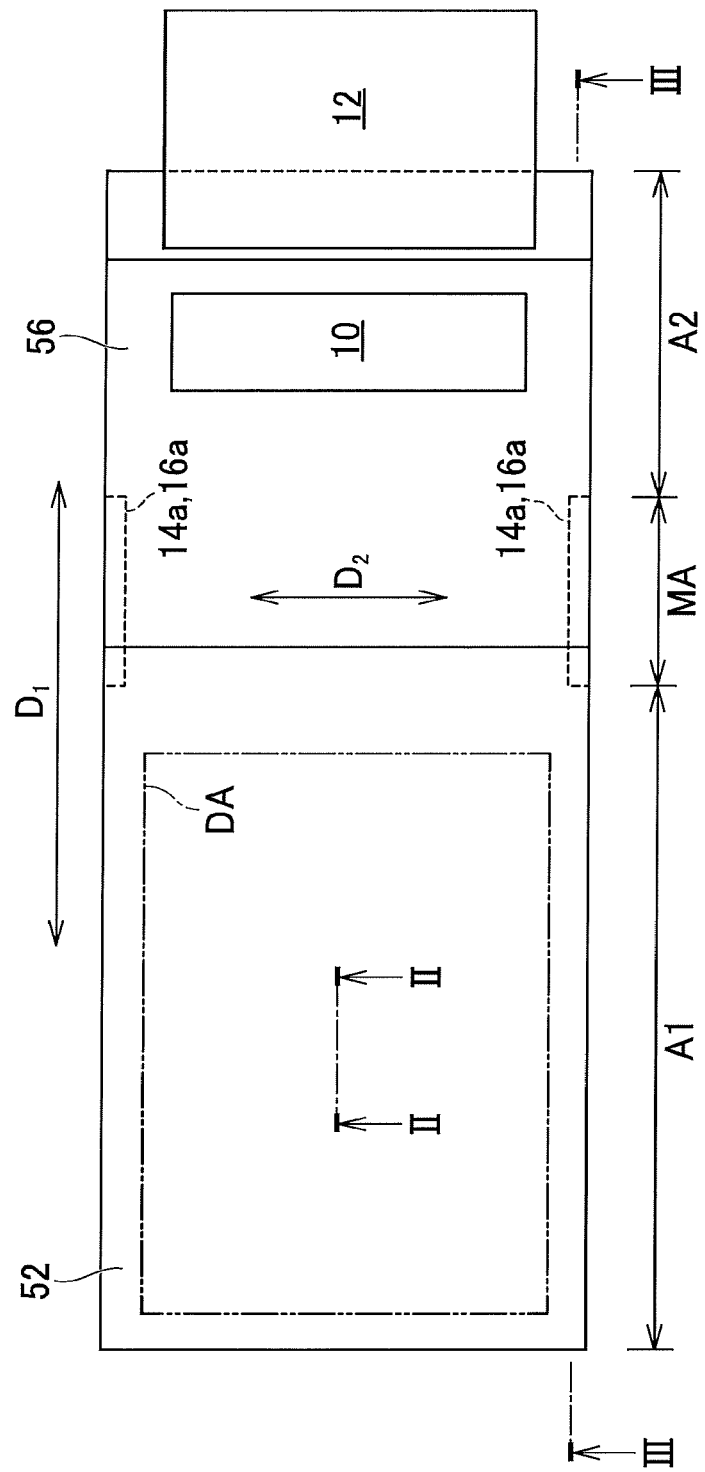
FIG. 1 is a plan view of a display device according to a first embodiment of the present invention.

Hereinafter, embodiments of the present invention will be described with reference to the drawings. However, the present invention may be embodied in various aspects without departing from the gist thereof, and the present invention is not intended to be construed as being limited to the description contents of the embodiments exemplified below.

In order to more clarify description, a width, a thickness, a shape, and the like of each portion may be schematically represented compared with an actual shape in the drawings, but it is only an example and it is not intended to limit interpretation of the present invention. In this specification and respective figures, the same reference numerals are given to constituents having the same functions as those described with reference to preceding figures, and redundant description thereof may be omitted.

Furthermore, in the detailed description of the present invention, when defining a positional relationship between a certain constituent and another constituent, the "above" or "below" includes not only a case where the constituent is positioned above or below a certain constituent but also a case where other constituents are interposed between the constituents, unless otherwise specified.

First Embodiment

FIG. 1 is a plan view of a display device according to a first embodiment of the present invention. An organic electroluminescence display device is included as an example of a display device. For example, the display device displays a full-color image by combining a plurality of pixels (subpixels) of red, green and blue. The display device has a display area DA in which the plurality of pixels are arranged in a matrix. An integrated circuit chip 10 for driving an element for displaying an image is mounted on the display device, and a flexible printed substrate 12 is connected to the display device for electrical connection to the outside.

Figure 2:
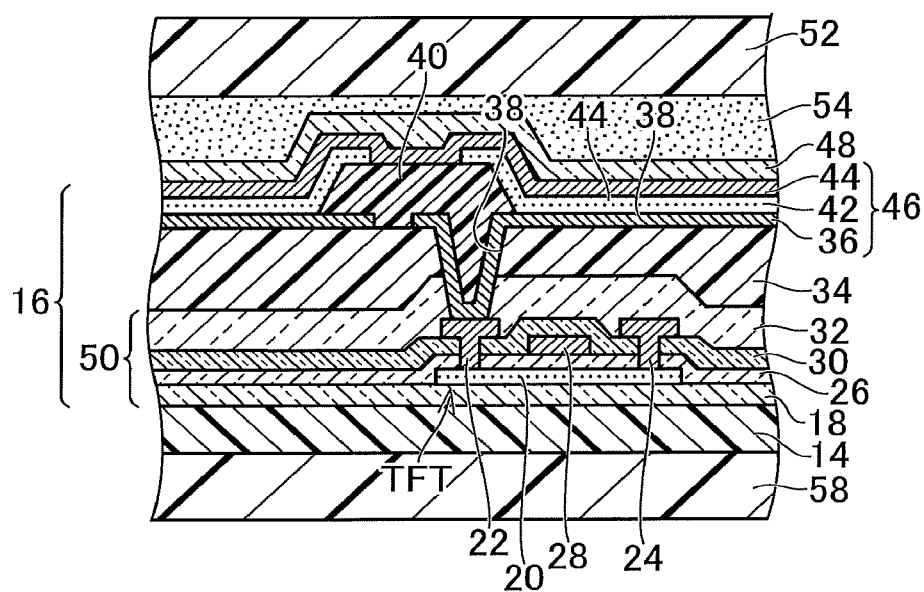
FIG. 2 is an enlarged view of a portion of a cross section taken along line II-II of the display device illustrated in FIG. 1.

FIG. 2 is an enlarged view of a portion of a cross section taken along line II-II of the display device illustrated in FIG. 1. The display device has a resin substrate 14 (also, simply referred to as a substrate). The resin substrate 14 has a rectangular (for example, oblong) outer shape. The resin substrate 14 is formed of a polyimide resin, a polyethylene terephthalate, or the like and has pliability. Therefore, the display device is bendable. In the present embodiment, a substrate having pliability and flexibility such as an ultrathin glass substrate can be adopted, instead of the resin substrate 14.

On the front surface of the resin substrate 14, a display circuit layer 16 composed of a plurality of layers is laminated. The display circuit layer 16 includes an undercoat layer 18 serving as a barrier against impurities contained in the resin substrate 14. The undercoat layer 18 is made of an inorganic material such as a silicon oxide film or a silicon nitride film and may have a laminated structure of the films. A semiconductor layer 20 is formed on the undercoat layer 18. A source electrode 22 and a drain electrode 24 are electrically connected to the semiconductor layer 20 and a gate insulating film 26 is formed so as to cover the semiconductor layer 20. The gate insulating film 26 is also made of an inorganic material. A gate electrode 28 is formed on the gate insulating film 26 and an interlayer insulating film 30 is formed so as to cover the gate electrode 28. The interlayer insulating film 30 is also made of an inorganic material. The source electrode 22 and the drain electrode 24 penetrate through the gate insulating film 26 and the interlayer insulating film 30. At least a portion of a thin film transistor TFT is constituted by the semiconductor layer 20, the source electrode 22, the drain electrode 24, and the gate electrode 28. A passivation film 32 is provided so as to cover the thin film transistor TFT. The passivation film 32 is also made of an inorganic material.

A planarization layer 34 is provided on the passivation film 32. On the planarization layer 34, a plurality of pixel electrodes 36 (for example, anodes) are provided so as to correspond to a plurality of pixels (sub-pixels), respectively. The planarization layer 34 is formed so that at least a surface on which the pixel electrode 36 is provided is flat. As the planarization layer 34, an organic material such as a photosensitive acrylic resin or the like is frequently used. The pixel electrode 36 is electrically connected to one of the source electrode 22 and the drain electrode 24 on the semiconductor layer 20 by a contact hole 38 penetrating through the planarization layer 34 and the passivation film 32.

An insulating layer 40 is formed on the planarization layer 34 and the pixel electrode 36. The insulating layer 40 is placed on the periphery of the pixel electrode 36 and is formed so as to open a portion (for example, a central portion) of the pixel electrode 36. A bank surrounding a portion of the pixel electrode 36 is formed by the insulating layer 40.

A light emitting layer 42 is provided on the pixel electrode 36. The light emitting layer 42 is provided separately for each pixel electrode 36 and is adapted to emit blue, red, or green light by being corresponded to each pixel. The color corresponding to each pixel is not limited to blue, red, or green, for example, yellow and white may be added. The light emitting layer 42 is formed by vapor deposition, for example. Otherwise, the light emitting layer 42 may be formed to extend over a plurality of pixels on the entire surface covering the display area DA illustrated in FIG. 1. That is, the light emitting layer 42 may be formed to be continuous on the insulating layer 40. In this case, the light emitting layer 42 is formed by coating by solvent dispersion. In a case where the light emitting layer 42 is formed so as to extend over a plurality of pixels, it is configured in such a way that the light emitting layer emits white light in all the sub-pixels and a desired color wavelength portion is extracted through a color filter (not illustrated).

A common electrode 44 (for example, a cathode) is provided on the light emitting layer 42. The common electrode 44 is placed on the insulating layer 40 serving as the bank. The common electrode 44 is continuous above adjacent pixel electrodes 36. The light emitting layer 42 is sandwiched between the pixel electrode 36 and the common electrode 44, luminance thereof is controlled by the current flowing between the pixel electrode 36 and the common electrode 44, and emits light. At least one of a hole transport layer and a hole injection layer (not illustrated) may be provided between the light emitting layer 42 and the pixel electrode 36. At least one of an electron transport layer and an electron injection layer (not illustrated) may be provided between the light emitting layer 42 and the common electrode 44. At least a portion of a light emitting element 46 is constituted by the pixel electrode 36, the light emitting layer 42, and the common electrode 44.

A sealing layer 48 covers the plurality of light emitting elements 46. With this, the light emitting elements 46 are cut off from moisture. The sealing layer 48 includes an inorganic film such as SiN or SiOx, may be a single layer, or may have a laminated structure. For example, the laminated structure may be a structure in which an organic film made of a resin or the like such as acrylic is sandwiched between a pair of inorganic films in upper and lower sides.

The display circuit layer 16 includes at least a plurality of layers below the sealing layer 48 laminated on the resin substrate 14, and may include the sealing layer 48. The display circuit layer 16 includes the light emitting element 46, a thin film transistor TFT, and an inorganic insulating layer 50. The inorganic insulating layer 50 includes at least one layer of the undercoat layer 18, the gate insulating film 26, the interlayer insulating film 30, and the passivation film 32.

Figure 3:
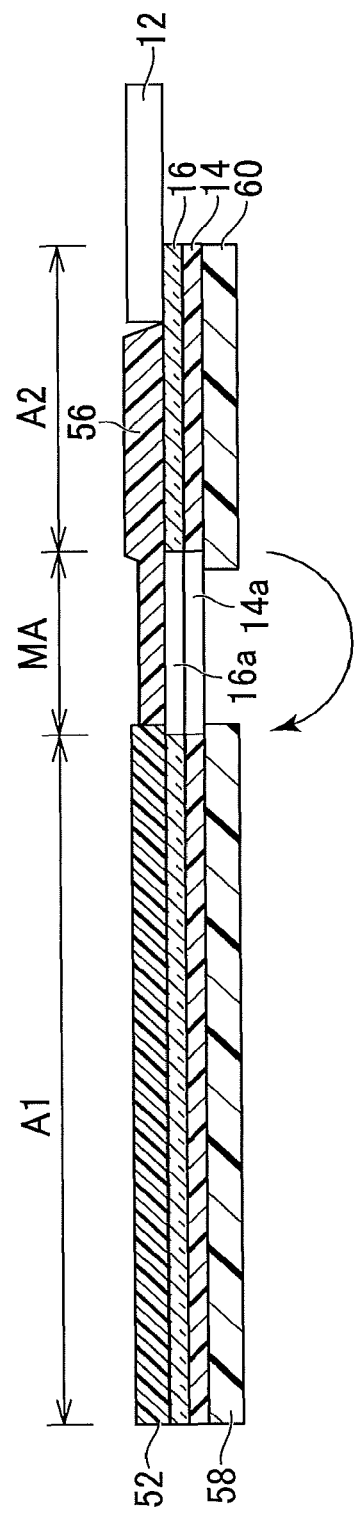
FIG. 3 is a cross-sectional view taken along line III-III of the display device illustrated in FIG. 1.

FIG. 3 is a cross-sectional view taken along line III-III of the display device illustrated in FIG. 1. The display circuit layer 16 includes a first area A1. The display area DA is included in the first area A1. The display circuit layer 16 includes a second area A2 spaced apart from the first area A1 in a first direction D1. As illustrated in FIG. 1, the integrated circuit chip 10 is mounted on the second area A2 and the flexible printed substrate 12 is connected thereto.

The display circuit layer 16 has a middle area MA between the first area A1 and the second area A2. As indicated by an arrow in FIG. 3, the display device is bent in the middle area MA. As illustrated in FIG. 1, the middle area MA has a width narrower in the second direction D2 orthogonal to the first direction D1 than that of any of the first area A1 and the second area A2. That is, the display circuit layer 16 has hollows 16a so as to be constricted at the middle area MA. In other words, the hollows 16a are portions recessed in the second direction D2 at the middle area MA. With this, ease of bending of the display device is improved. The inorganic insulating layer 50 is positioned on an edge (also, referred to as an end portion) of the hollows 16a. The resin substrate 14 also has hollows 14a. The hollows 14a of the resin substrate 14 coincide with the hollows 16a of the display circuit layer 16.

The display device has a front film 52 (first film). The front film 52 is stuck to the display circuit layer 16 and overlaps the first area A1. As illustrated in FIG. 2, a filling layer 54 is interposed between the front film 52 and the display circuit layer 16. The front film 52 overlaps the display area DA, has light transparency for displaying an image, and is transparent. The front film 52 is an optical clear film or a polarizing plate. The first area A1 is located at a position where the display device is not bent and flatness of the display circuit layer 16 is maintained in the first area A1 by sticking the front film 52 thereto. As illustrated in FIGS. 1 and 3, the front film 52 protrudes from the hollows 16a of the display circuit layer 16 at the boundary between the first area A1 and the middle area MA.

The display device has a resin layer 56. The resin layer 56 is provided on the display circuit layer 16 and is adjacent to the front film 52. The resin layer 56 ranges from the middle area MA to the second area A2. The resin layer 56 is cured and is adhered to the display circuit layer 16. The resin layer 56 is laminated on the display circuit layer 16 so as to make it possible to dispose a neutral surface, which does not cause elongation and contraction due to bending, on the display circuit layer 16, in the bent middle area MA. With this, it is possible to prevent disconnection of wirings (not illustrated)

and cracking of the inorganic insulating layer 50 in the display circuit layer 16. Since the resin layer 56 can be formed by selecting materials suitable for bending and materials from which the film thickness can be easily adjusted, there is room for selection of materials. The resin layer 56 protrudes from the hollows 16a at the boundary between the second area A2 and the middle area MA.

A first back film 58 (second film) is stuck to the back surface of the resin substrate 14. The first back film 58 overlaps the first area A1 and protrudes from the hollows 16a at the boundary between the first area A1 and the middle area MA. A second back film 60 (third film) is stuck to the back surface of the resin substrate 14. The second back film 60 overlaps the second area A2 and protrudes from the hollows 16a at the boundary between the second area A2 and the middle area MA. The first back film 58 and the second back film 60 are separated from each other by the middle area MA in the first direction D1.

Figure 4:
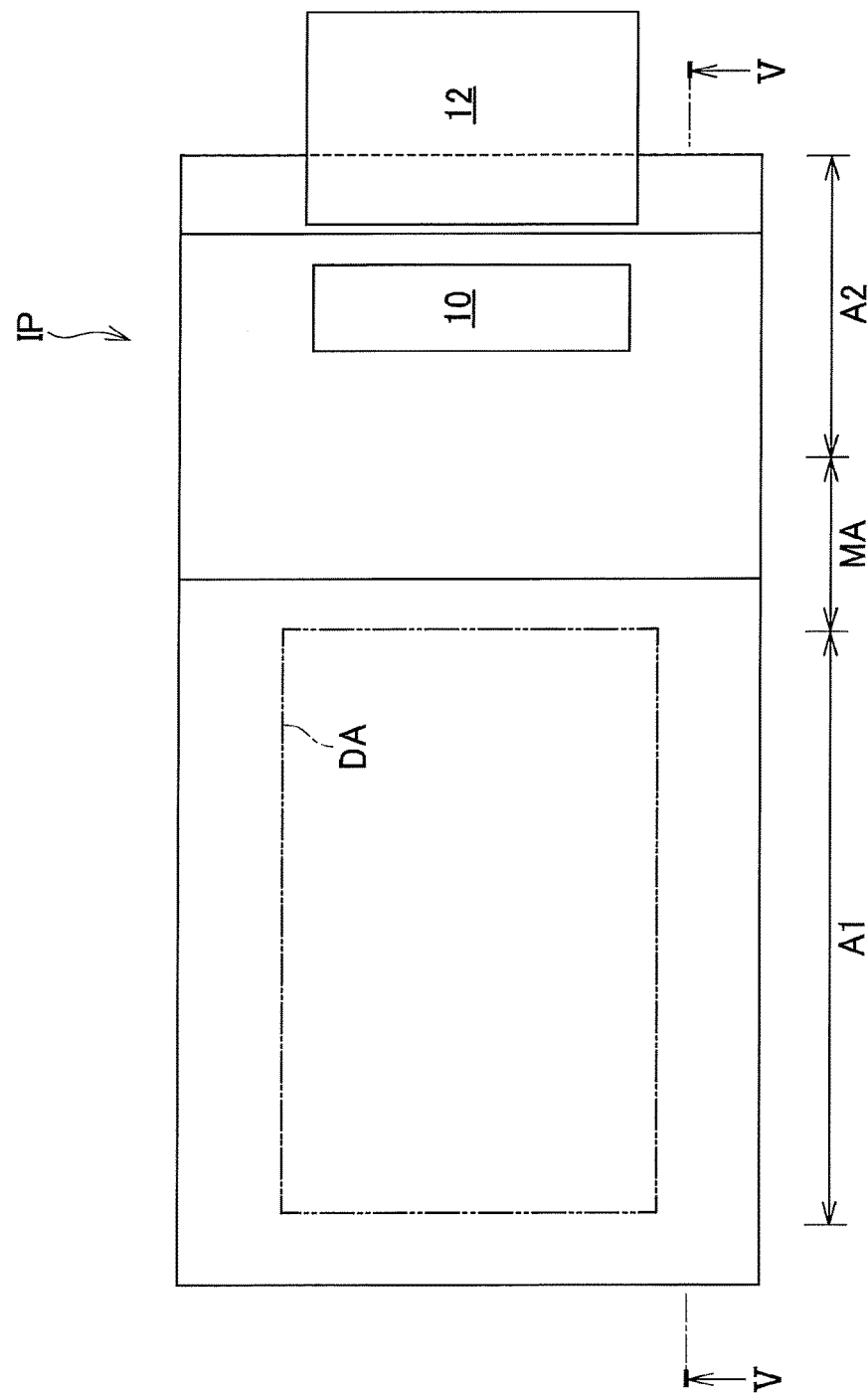
FIG. 4 is a diagram illustrating an intermediate product in the middle of manufacturing.
Figure 5:
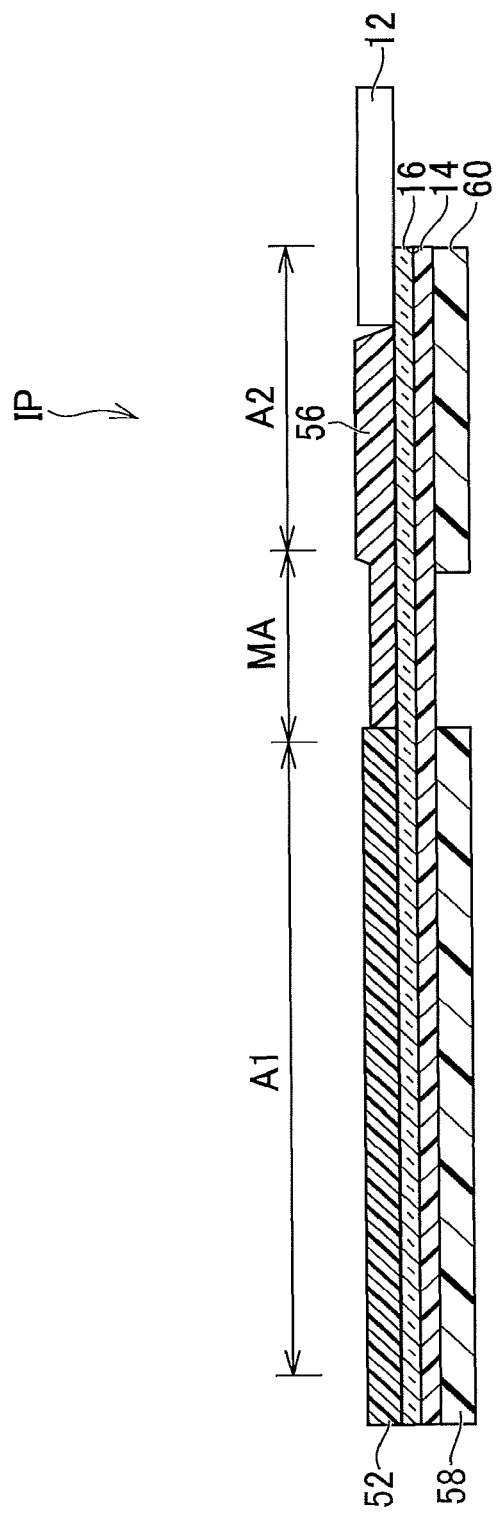
FIG. 5 is a cross-sectional view taken along line V-V of the intermediate product illustrated in FIG. 4.

Next, a manufacturing method for the display device according to the first embodiment of the present invention will be described with reference to FIGS. 4 to 8. FIG. 4 is a diagram illustrating an intermediate product in the middle of manufacturing. FIG. 5 is a cross-sectional view taken along line V-V of the intermediate product illustrated in FIG. 4.

As illustrated in FIGS. 4 and 5, an intermediate product IP including the resin substrate 14 on which the display circuit layer 16 is laminated is prepared. The intermediate product IP is cut in a later process and thus, the intermediate product IP is larger than the product illustrated in FIG. 1. The display circuit layer 16 has the first area A1 and the second area A2 that are separated from each other in the first direction D1. The display area DA is included in the first area A1. The display circuit layer 16 has the middle area MA between the first area A1 and the second area A2.

In this process, the resin substrate 14 is prepared and the display circuit layer 16 is formed on the front surface of the resin substrate 14. On the display circuit layer 16, the front film 52 is stuck so as to overlap the first area A1. The integrated circuit chip 10 is bonded to the second area A2 and the flexible printed substrate 12 is connected to the second area A2.

The resin layer 56 is formed on the display circuit layer 16. The resin layer 56 is formed so as to range from the middle area MA to the second area A2 adjacently to the front film 52. The first back film 58 is stuck to the back surface of the resin substrate 14. The first back film 58 is stuck so as to overlap the first area A1 and protrude to the middle area MA. The second back film 60 is stuck to the back surface of the resin substrate 14. The second back film 60 is stuck so as to overlap the second area A2 and protrude to the middle area MA. The first back film 58 and the second back film 60 are disposed so as to be separated from each other by the middle area MA in the first direction D1.

Figure 6:
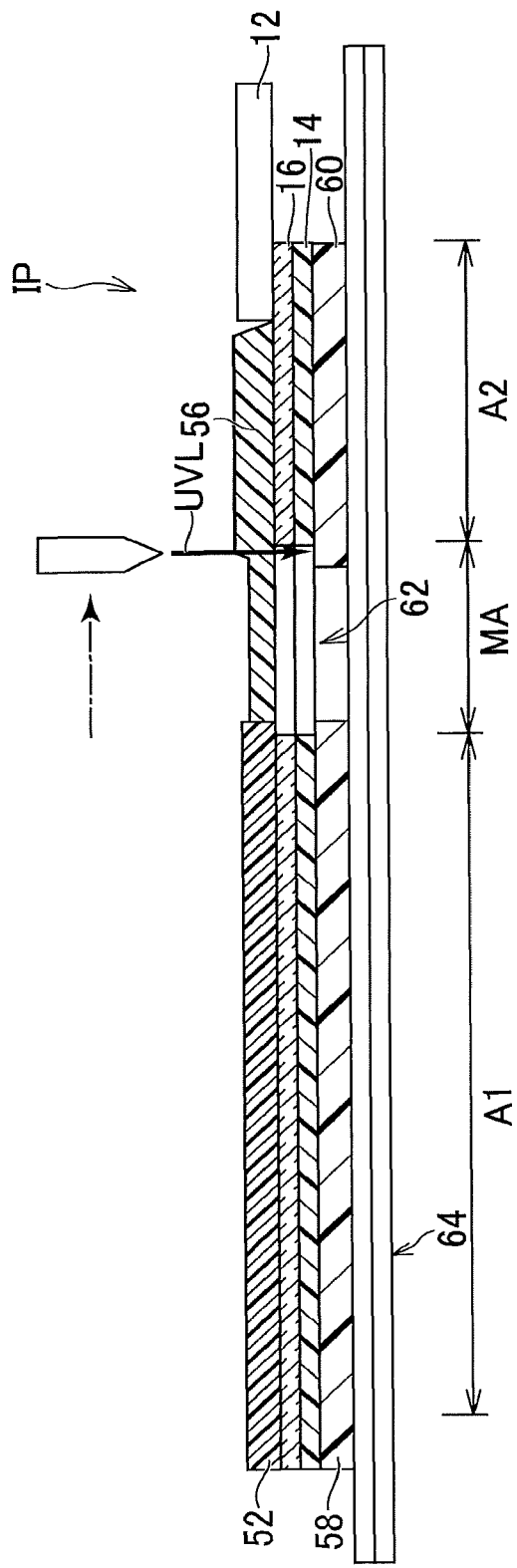
FIG. 6 is a diagram illustrating a process for forming through-holes.

Next, as illustrated in FIG. 6, the middle area MA of the display circuit layer 16 is irradiated with ultraviolet laser light UVL. Although ultraviolet laser light UVL is irradiated so as to pass through the front film 52 and the resin layer 56, ultraviolet laser light UVL is adjusted to have a wavelength at which a heat absorption rate is lowered. By doing as described above, although a hole is not formed in the front film 52 and the resin layer 56, through-holes 62 is formed in the middle area MA of the display circuit layer 16 by ultraviolet laser light UVL. The middle area MA is irradiated with ultraviolet laser light UVL to a position inside thereof which overlaps mutually facing ends of the first back film 58 and the second back film 60. The ultraviolet laser light UVL is emitted with intensity capable of reaching the back surface of the resin substrate 14. That is, the through-holes 62 are formed so as to penetrate through the resin substrate 14.

Figure 7:
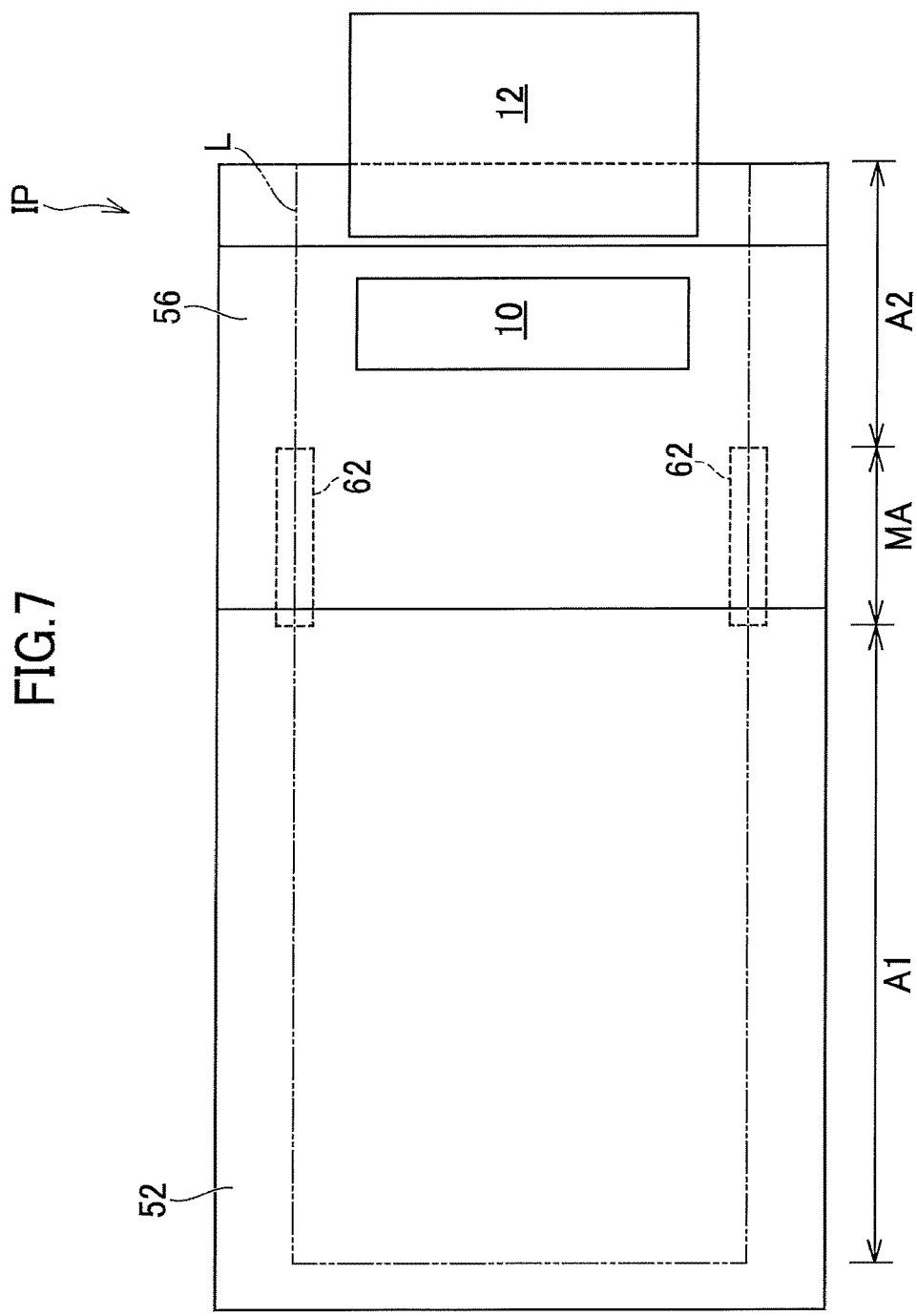
FIG. 7 is a plan view of a process for cutting a product.
Figure 8:
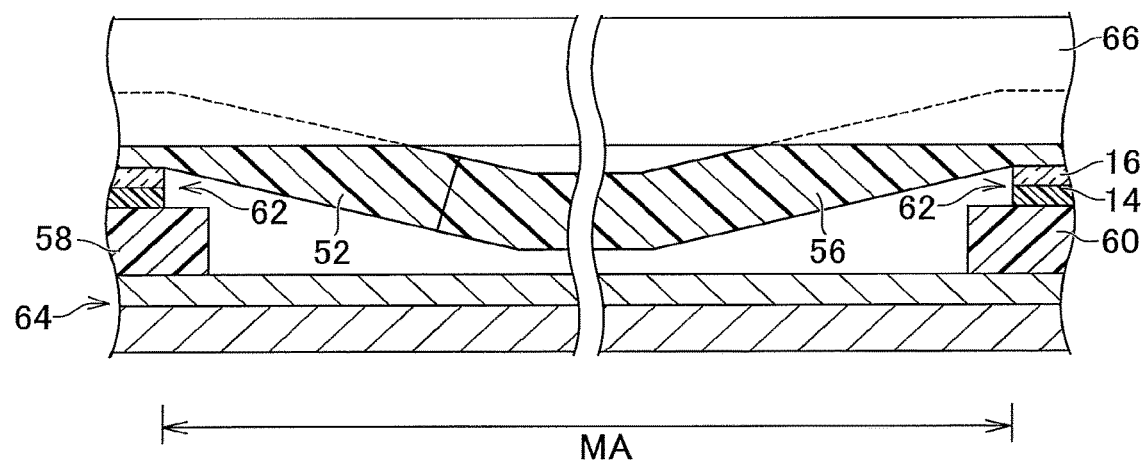
FIG. 8 is a cross-sectional view of the process for cutting out the product.

Next, the product is cut out along a cutting line L which passes through the through-holes 62. FIG. 7 is a plan view of a process for cutting the product. FIG. 8 is a cross-sectional view of a process for cutting out the product. This process is performed by directing the first back film 58 and the second back film 60 downward. Accordingly, the middle area MA of the display circuit layer 16 is bridged over the first back film 58 and the second back film 60. On the stage 64, a cutter 66 is abutted to sides of the front film 52 and the resin layer 56. The middle area MA of the display circuit layer 16 is bent in the direction toward the stage 64 by pressing of the cutter 66.

According to the present embodiment, the product is cut out along the cutting line L which passes through the through-holes 62. For that reason, even when the middle area MA of the display circuit layer 16 is bent, defects due to deformation are hardly generated.

Second Embodiment

Figure 9:
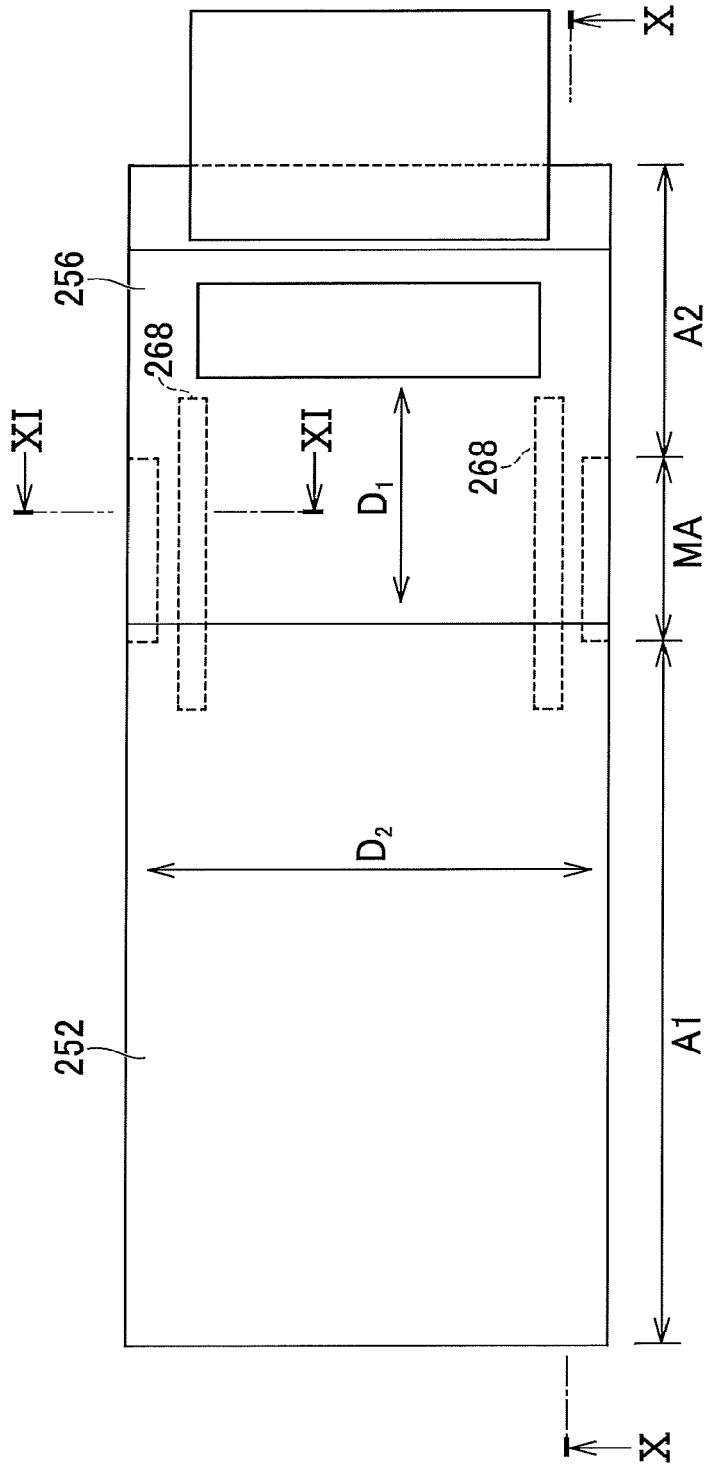
FIG. 9 is a plan view illustrating a display device according to a second embodiment of the present invention.
Figure 10:
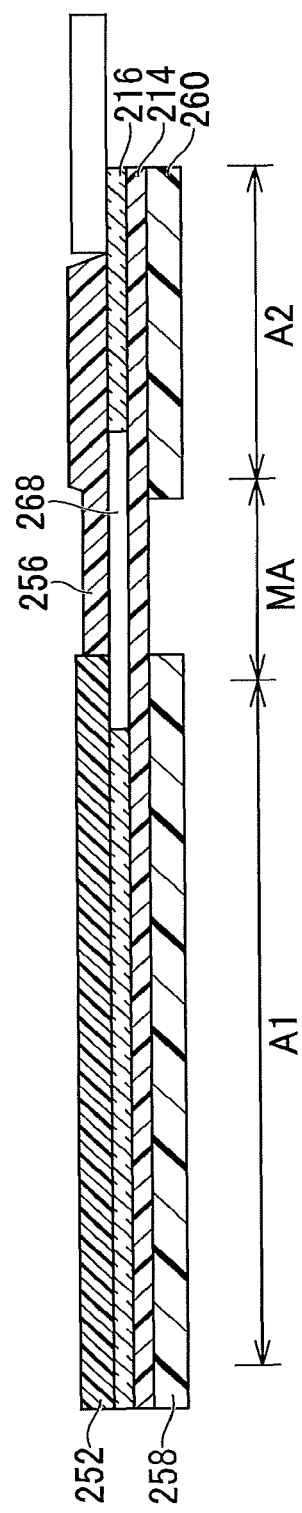
FIG. 10 is a cross-sectional view taken along line X-X of the display device illustrated in FIG. 9.
Figure 11:
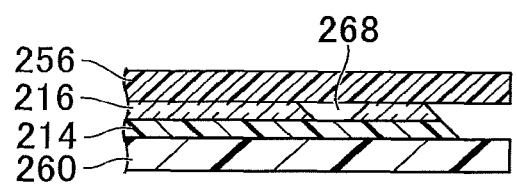
FIG. 11 is a cross-sectional view taken along line XI-XI of the display device illustrated in FIG. 9.

FIG. 9 is a plan view illustrating a display device according to a second embodiment of the present invention. FIG. 10 is a cross-sectional view taken along line X-X of the display device illustrated in FIG. 9. FIG. 11 is a cross-sectional view taken along line XI-XI of the display device illustrated in FIG. 9.

In the present embodiment, in addition to the structure of the display device illustrated in FIG. 1, slits 268 are formed in the middle area MA of a display circuit layer 216. The slits 268 are respectively present on both sides in the second direction D2 orthogonal to the first direction D1 and extend in the first direction D1. The slits 268 reach at least one of the first area A1 and the second area A2. A front film 252 protrudes to the middle area MA and overlaps the slits 268. A resin layer 256 overlaps the slits 268. A first back film 258 and a second back film 260 are separated from each other by the middle area MA in the first direction D1, and mutually facing end portions overlap the slits 268. According to the present embodiment, the slits 268 are formed in the middle area MA of the display circuit layer 216, so that ease of bending of the display device is improved. Other structures correspond to the contents described in the first embodiment.

The slits 268 can be formed by applying the forming method for the through-holes 62 described in the first embodiment. For example, portions which are adjacent to the through-holes 62 in the inside of the product are irradiated with ultraviolet laser light with intensity not reaching the back surface of the resin substrate 214. The front surface of the resin substrate 214 may be somewhat cut. Ultraviolet laser light is irradiated through the front film 252 and the resin layer 256. With this, the slits 268 are formed in the middle area MA of the display circuit layer 216. Then, in the process for cutting out the product, the cutting line is set outside the slits 268 by avoiding the slits 268.

Third Embodiment

Figure 12:
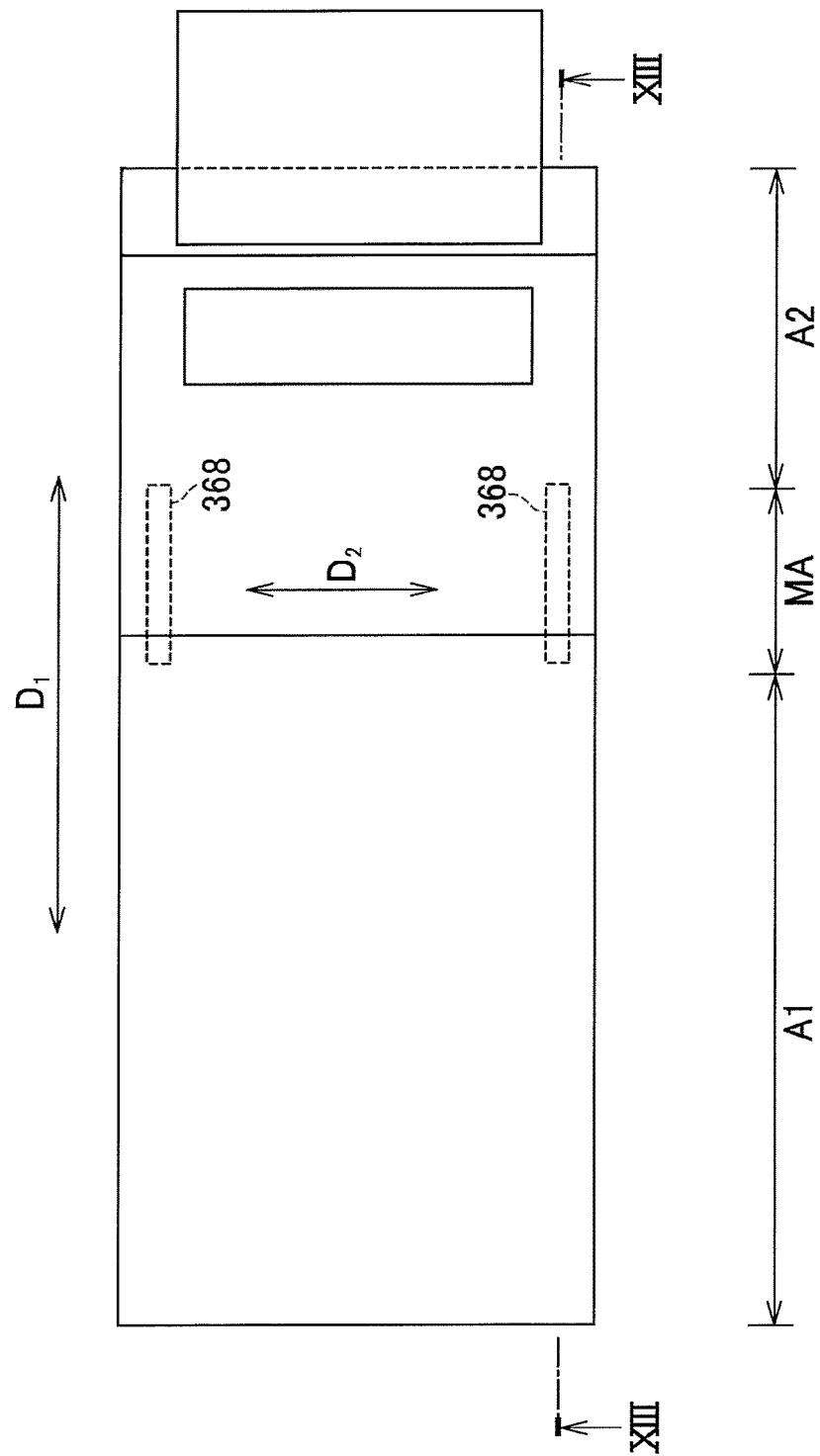
FIG. 12 is a plan view illustrating a display device according to a third embodiment of the present invention.
Figure 13:
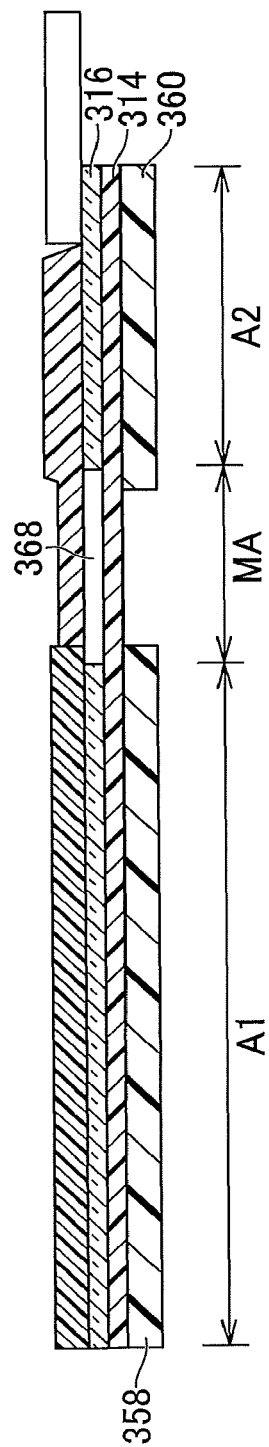
FIG. 13 is a cross-sectional view taken along line XIII-XIII of the display device illustrated in FIG. 12.

FIG. 12 is a plan view illustrating a display device according to a third embodiment of the present invention. FIG. 13 is a cross-sectional view taken along the line XIII-XIII of the display device illustrated in FIG. 12.

In this embodiment, slits 368 are formed in the middle area MA of a display circuit layer 316 instead of the hollows 16a illustrated in FIG. 1. In other words, an area where the slits 368 extend in the first direction DA is the middle area MA. The slits 368 are respectively present on both sides in the second direction D2 orthogonal to the first direction D1 and extend in the first direction D1. A front film 352 protrudes to the middle area MA and overlaps the slits 368. A resin layer 356 overlaps the slits 368. The first back film 358 and the second back film 360 are separated from each other by the middle area MA in the first direction D1, and mutually facing end portions overlap the slits 368. According to the present embodiment, the slits 368 are formed in the middle area MA of the display circuit layer 316 and thus, ease of bending of the display device is improved. Other structures correspond to the contents described in the first embodiment.

Figure 14:
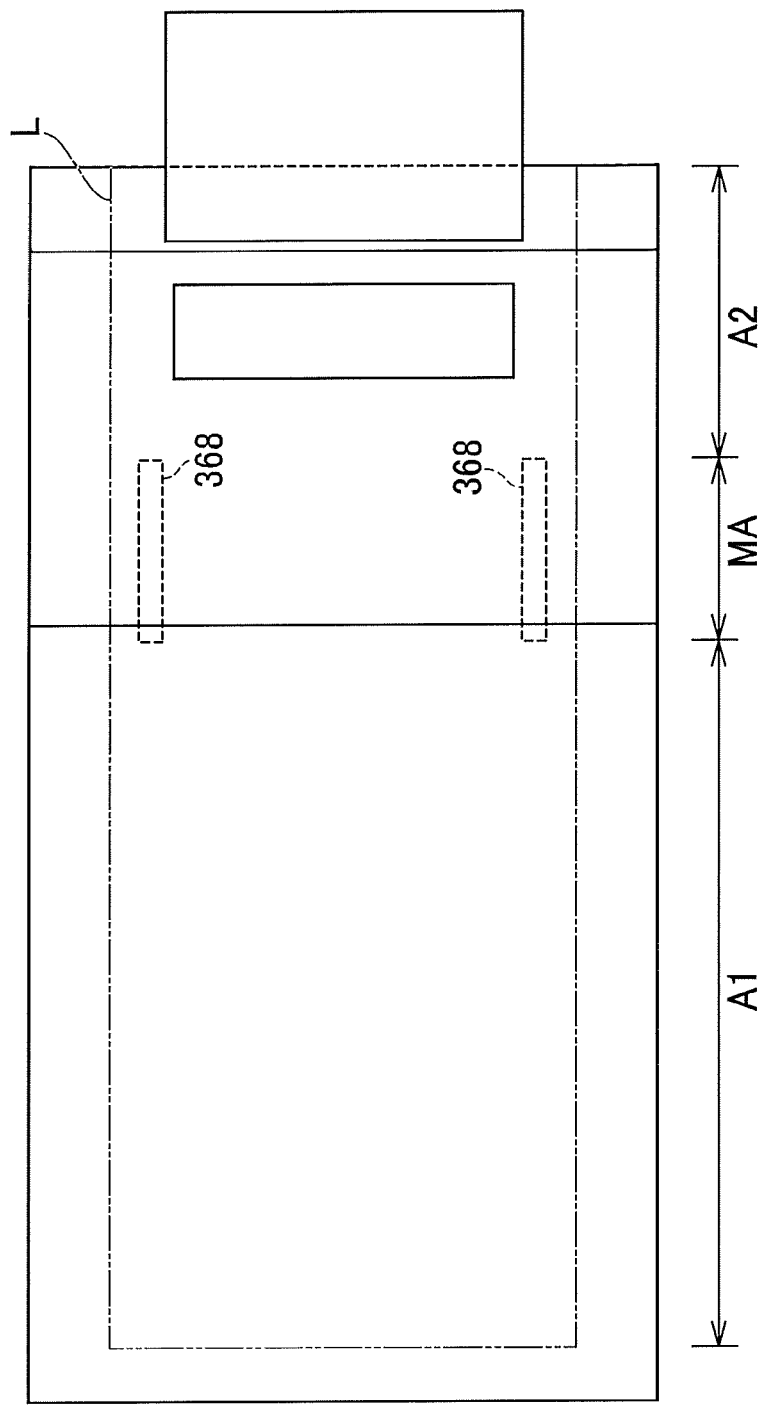
FIG. 14 is a diagram illustrating a manufacturing method for a display device according to a third embodiment of the present invention.

FIG. 14 is a diagram illustrating a manufacturing method for a display device according to a third embodiment of the present invention. In the manufacturing method for the display device, slits 368 are formed in the middle area MA of the display circuit layer 316 by ultraviolet laser light. As illustrated in FIG. 13, although ultraviolet laser light is emitted with an intensity not reaching the back surface of the resin substrate 314, the front surface of the resin substrate 314 may be somewhat cut. The middle area MA is irradiated with ultraviolet laser light to a position inside thereof which overlaps mutually facing ends of the first back film 358 and the second back film 360. The product is cut along the cutting line L which passes through outside the slits 368 by avoiding the slits 368. Details of this process correspond to the contents described in the first embodiment.

According to the present embodiment, the product is cut out along the cutting line L which passes through outside the slits 368. For that reason, even when the middle area MA of the display circuit layer 316 is bent and a crack is generated, the crack is less likely to expand inside the product, so that defects due to deformation are hardly generated.

Fourth Embodiment

Figure 15:
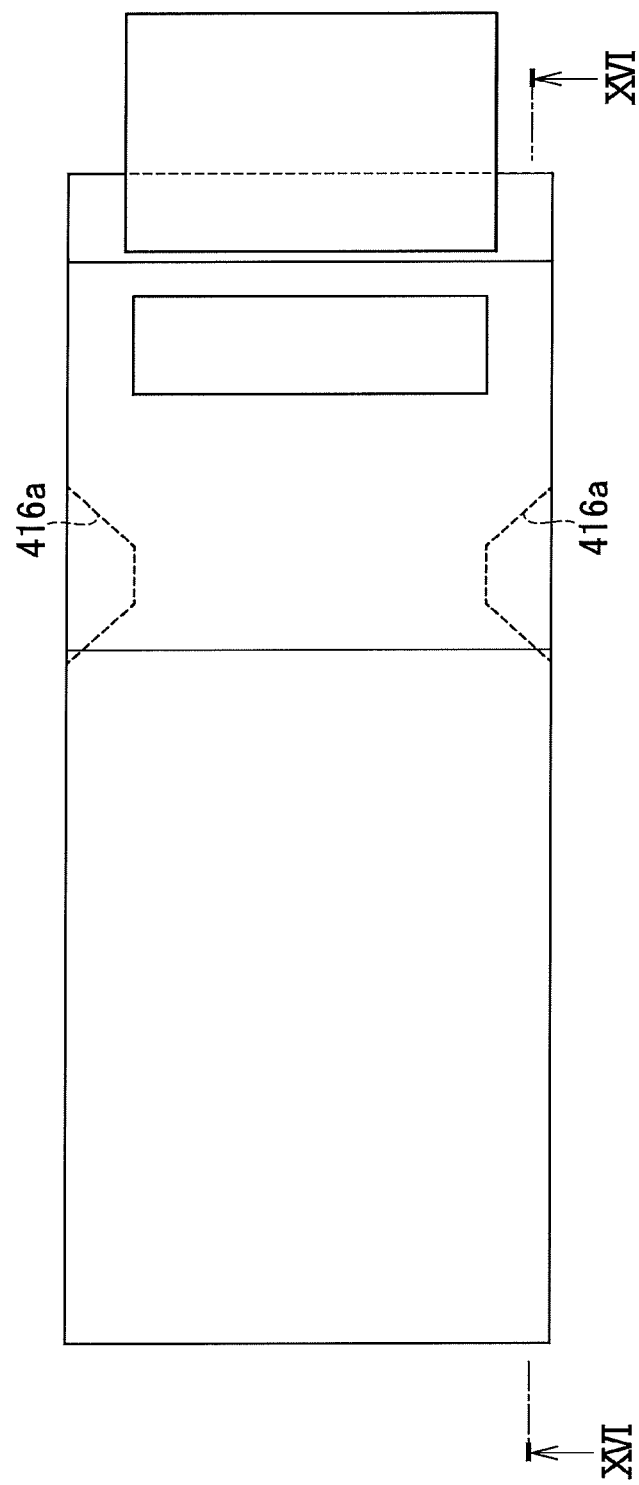
FIG. 15 is a plan view illustrating a display device according to a fourth embodiment of the present invention.
Figure 16:
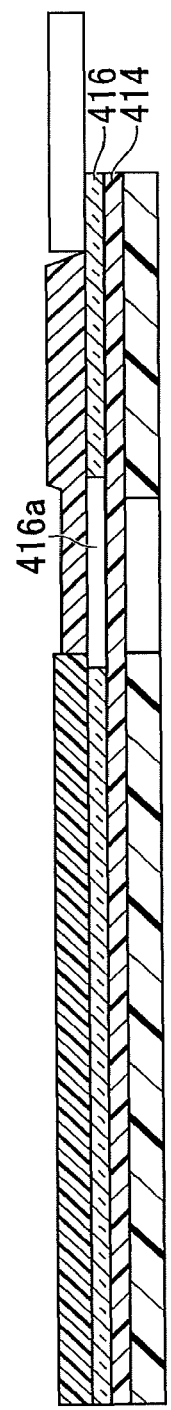
FIG. 16 is a cross-sectional view taken along line XVI-XVI of the display device illustrated in FIG. 15.

FIG. 15 is a plan view illustrating a display device according to a fourth embodiment of the present invention. FIG. 16 is a cross-sectional view taken along the line XVI-XVI of the display device illustrated in FIG. 15.

In the present embodiment, a display circuit layer 416 has hollows 416a. In the hollows 16a illustrated in FIG. 1, the depth of the recess is uniform, whereas in the hollows 416a illustrated in FIG. 15, the recess becomes gradually deeper from both ends toward the center as illustrated in FIG. 15. A resin substrate 414 does not have the hollows and protrudes from the hollows 416a of the display circuit layer 416. Other structures correspond to the contents described in the first embodiment.

FIG. 17 is a diagram for explaining the manufacturing method for the display device according to the third embodiment of the present invention. In the process for forming through-holes 462, the through-holes 462 are formed so as to reach the inside of the product by avoiding a line segment between two points A and B spaced apart from each other on the cutting line L. Although ultraviolet laser light is emitted with intensity not reaching the back surface of the resin substrate 414, the front surface of the resin substrate 414 may be somewhat cut. Other processes correspond to the contents described in the first embodiment.

The display device is not limited to an organic electroluminescence display device and may be a display device including a light emitting element such as a quantum dot light emitting diode (QLED) in each pixel and may also be a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a substrate having a front surface and a back surface;
   a display circuit layer laminated on the front surface, the display circuit layer including a first area and a second area that are aligned in a first direction and apart from each other, the display circuit layer including a middle area positioned between the first area and the second area and having a narrower width in a second direction orthogonal to the first direction than widths of the first area and the second area in the second direction, the display circuit layer having at least one hollow located in the middle area and recessed in the second direction;
   a first film overlapped with the first area and stuck to the display circuit layer;
   a resin layer provided on the display circuit layer, ranging from the middle area to the second area, and being adjacent to the first film;
   a second film overlapped with the first area and stuck to the back surface of the substrate; and
   a third film positioned apart from the second film, overlapped with the second area, and stuck to the back surface of the substrate,
   wherein the display circuit layer includes a light emitting element, a thin film transistor, and an inorganic insulating layer, and
   the inorganic insulating layer is positioned at an edge of the hollow.

2. The display device according to claim 1, wherein the substrate has another hollow overlapping the hollow of the display circuit layer.

3. The display device according to claim 1, wherein the substrate is a resin substrate having flexibility.

4. The display device according to claim 1, wherein the display circuit layer has a first end portion extending in a first direction and a second end portion facing the first end portion, and
   the at least one hollow comprises a first hollow positioned at the first end portion and a second hollow separated from the first hollow and positioned at the second end portion.

5. The display device according to claim 1, wherein the display circuit layer has a slit facing the edge of the hollow and extending in the first direction.

6. The display device according to claim 5, wherein the slit reach at least one of the first area and the second area.

7. A display device comprising:
   a substrate having a front surface and a back surface;
   a display circuit layer laminated on the front surface, the display circuit layer including a first area and a second area that are aligned in a first direction and apart from each other in the first direction, the display circuit layer including a middle area positioned between the first area and the second area and having a slit extending in the first direction;
   a first film overlapped with the first area and stuck to the display circuit layer;
   a resin layer provided on the display circuit layer, ranging from the middle area to the second area, and being adjacent to the first film;
   a second film stuck to the back surface of the substrate, overlapped with the first area, and protruding toward the middle area; and a third film stuck to the back surface of the substrate, overlapped with the second area, and protruding toward the middle area, wherein the display circuit layer includes a light emitting element, a thin film transistor, and an inorganic insulating layer, the resin layer overlaps the slit, the second film has a first end portion overlapped with the slit, and the third film has a second end portion facing the first end portion and overlapped with the slit.

8. The display device according to claim 7, wherein the first film protrudes toward the middle area and overlaps the slit.

9. A manufacturing method for a display device, the method comprising:

forming a display circuit layer on a front surface of a resin substrate, the display circuit layer including a first area, a second area aligned in a first direction and apart from each other, and a middle area positioned between the first area and the second area;

sticking a front film to the display circuit layer so as to overlap the first area;

forming a resin layer on the display circuit layer so as to be adjacent to the front film and to range from the middle area to the second area;

sticking a first back film to a back surface of the resin substrate so as to overlap the first area and protrude toward the middle area;

sticking a second back film to the back surface of the resin substrate so as to overlap the second area and protrude toward the middle area;

forming through-holes in the middle area of the display circuit layer by irradiating the middle area with ultraviolet laser light through the front film and the resin layer; and cutting the resin substrate along a cutting line passing through the through-holes by abutting a cutter to sides of the front film and the resin layer on a stage by directing the first back film and the second back film downward, wherein the first back film has a first end portion overlapped, the second back film has a second end portion facing the first end portion, in a step of forming the through-holes, a first area and a second area are irradiated with the ultraviolet laser light, the first area overlapping the first back film, the second area overlapping the second back film, and in a step of cutting the resin substrate, the middle area of the display circuit layer is bridged over the first back film and the second back film, and is bent in a direction toward the stage by pressing of the cutter.

10. The manufacturing method according to claim 9, wherein, in the step of forming the through-holes, the ultraviolet laser light is emitted with intensity so as to reach the back surface of the resin substrate, the through-holes are formed so as to penetrate through the resin substrate.

11. The manufacturing method according to claim 9, wherein, in the step of forming the through-holes, the ultraviolet laser light emitted with intensity so as not to reach the back surface of the resin substrate.

12. The manufacturing method according to claim 9, wherein, the display circuit layer includes light emitting elements, in the step of forming the through holes, the through-holes are formed so as to avoid a line segment between two points spaced apart on the cutting line and to be positioned inside of the cutting line, the inside overlapping the light emitting elements.

13. The manufacturing method according to claim 9, further comprising:

forming a slit in the middle area by irradiating with the ultraviolet laser light through the front film and the resin layer with intensity so as not to reach the back surface of the resin substrate, the slit being adjacent to the through-holes, wherein, in the step of cutting the resin substrate, the cutting line is set outside of the slit by avoiding the slit.

* * * * *